United States Patent [19]

Chihara et al.

[11] Patent Number: 4,933,259
[45] Date of Patent: Jun. 12, 1990

[54] ALKALINE DEVELOPABLE LIQUID PHOTOIMAGEABLE SOLDER RESIST INK COMPOSITION

[75] Inventors: Machio Chihara; Mitsukazu Funahashi, both of Osaka, Japan

[73] Assignee: Arakawa Chemical Industries, Ltd., Osaka, Japan

[21] Appl. No.: 236,089

[22] Filed: Aug. 24, 1988

[30] Foreign Application Priority Data

Sep. 2, 1987 [JP] Japan .................................. 62-219803

[51] Int. Cl.$^5$ .............................................. G03C 1/68
[52] U.S. Cl. ..................................... 430/280; 430/281; 430/287; 522/100; 522/101; 522/102; 522/103; 525/502; 525/507; 525/922
[58] Field of Search ...................... 430/280, 281, 287; 525/502, 507, 922; 428/116; 522/100, 101, 102, 103

[56] References Cited

U.S. PATENT DOCUMENTS

| | | | |
|---|---|---|---|
| 3,661,576 | 5/1972 | Crary | 96/35.1 |
| 3,980,483 | 9/1976 | Nishikubo | 96/115 R |
| 4,003,877 | 1/1977 | Lipson et al. | 260/47 |
| 4,064,287 | 12/1977 | Lipson et al. | 427/53 |
| 4,101,398 | 7/1978 | Hesse et al. | 204/159.16 |
| 4,162,274 | 7/1979 | Rosenkranz | 528/75 |
| 4,252,888 | 2/1981 | Rohloff | 430/281 |
| 4,390,615 | 6/1983 | Courtney et al. | 430/315 |
| 4,442,197 | 4/1984 | Crivello et al. | 430/280 |
| 4,485,166 | 11/1984 | Herwig et al. | 430/260 |
| 4,540,752 | 9/1985 | McFadden | 525/531 |
| 4,544,623 | 10/1985 | Audykowski et al. | 430/280 |
| 4,786,579 | 11/1988 | Tazawa et al. | 439/280 |

FOREIGN PATENT DOCUMENTS 61-243869 10/1986 Japan .

*Primary Examiner*—Jack P. Brammer
*Attorney, Agent, or Firm*—Pennie & Edmonds

[57] ABSTRACT

A composition useful as an alkaline developable liquid photoimageable solder resist ink comprising a photocurable resin, a photopolymerization initiator, a reactive diluent, a solvent and optionally, a thermosetting material as main components wherein the photocurable resin comprises a reaction product of: (A) an epoxy vinyl ester resin obtained by reacting a cresol novolak epoxy resin and an unsaturated monobasic acid, (B) a polybasic acid anhydride and (C) an alkyl ketene dimer, wherein the hydroxyl value of the photocurable resin is not more than 10 carbons. Coating films formed from the subject composition have excellent adhesion, heat resistance, moisture insulation resistance and alkaline developable properties.

13 Claims, No Drawings

ALKALINE DEVELOPABLE LIQUID PHOTOIMAGEABLE SOLDER RESIST INK COMPOSITION

TABLE OF CONTENTS

1. Background of the Invention
   1.1. Technical Field
   1.2. Description of Related Art
2. Summary of the Invention
3. Detailed Description of the Preferred Embodiments
   3.1. Example 1
      3.1. (a) Physical Properties
         1. Acid Value
         2. Finger Tack
         3. Resistance to the developing solution on exposed portions of the developed coating film
         4. Resistance to the developing solution on unexposed portions of the developed coating film
         5. Pencil Hardness
         6. Adhesion
         7. Soldering heat resistance
         8. Solvent resistance
         9. Insulation resistance
   3.2. Example 2
   3.3. Example 3
   3.4. Example 4
   3.5. Example 5

1. BACKGROUND OF THE INVENTION

1.1. TECHNICAL FIELD

The present invention relates to compositions useful as an alkaline developable liquid photoimageable solder resist ink and the like, having excellent adhesion, heat resistance, and electrical insulating properties in an atmosphere having a high humidity. Moreover, the compositions of the invention are additionally developable in an aqueous alkaline system in contrast to related materials in the prior art.

1.2. DESCRIPTION OF RELATED ART

Solder resist inks have been employed in the prior art to prevent solder from spreading over portions of a printed circuit board where it is not required to protect the circuit. Various properties, such as adhesion, heat resistance, moisture resistance and chemical resistance are thus required for these solder resist inks.

Traditionally, solder imaging of printed circuit boards has been achieved by a process known as screen printing. With the growing complexity of printed circuit board design however, particularly in the professional markets, solder masks have had to cope with increasing demands on print definition. The screen process is thus being pushed to the limit of its capabilities.

To solve the problem described above, a so-called solvent developable photo resist has been developed. This type of photo resist has a secondary problem, however, in that it cannot be employed due to environmental and health problems caused by the large amount of solvent consumed in the process of its development.

Recently, so-called "dry film" photo resists, which do not employ an organic solvent, and so-called "liquid alkaline developable" photo resists have been developed. However, when dry film photo resists are employed, problems have occurred in the boundary area between the resist and the substrate during a subsequent thermocompression bonding process. In addition, the resultant photo resist lacks adhesion and heat resistance. Furthermore, the higher cost involved hampers wide use of this system.

Moreover, although many kinds of liquid alkaline developable photo resists have been developed, one which satisfies the requirements for all of the properties discussed above, such as adhesion, heat resistance, moisture resistance and developability in an alkaline system has not yet been produced. For example, in instances where an epoxy acrylate resin is utilized as the photo-curable resin, the material has been found to be hygroscopic and it thereby sacrifices its electrical insulating ability due to the many hydroxyl groups which remain in the resin. Further, it is necessary to add an alkaline-soluble binder into the photo-curable resin to produce an alkaline developable resin, and when the alkaline-soluble binder is contained in the photo-curable resin, the resultant system provides poor adhesion and heat resistance. In addition, to improve the ability of the photo resist to develop in an alkaline solution, an epoxy-acrylate resin, esterified with polybasic anhydride has been developed, but the resin thus produced has insufficient adhesion.

In order to improve its adhesive and non-hygroscopic properties, the resin described above has also been modified, as known in the prior art, with a urethane resin. However, urethane bonds in the resin structure reduce the solubility of the resin to a solvent which is an essential component in the process of preparing an ink composition. This results in the dilution of the effective components. Consequently, the material's chemical resistance and alkaline developable properties are deteriorated. Also, even though an alkaline-soluble binder is added to the resist, the ability of the material to be developed in an alkaline system is not improved.

2. SUMMARY OF THE INVENTION

It is thus an object of the present invention to provide a composition useful as, for example, an alkaline developable liquid photoimageable solder resist ink, having excellent adhesion and heat resistance, which is non-hygroscopic and which may be developed in an alkaline system when used on a printed circuit board. Alternately, products of the type described herein may be utilized for other applications, such as, for example, as a protective coating material on printing plates and the like. These and other objects of the present invention will become apparent from the description hereinafter.

In accordance with the present invention, therefore, there is thus provided a composition useful as an alkaline developable liquid photoimageable solder resist ink, comprising a photocurable resin, a photopolymerization initiator, a reactive diluent and a solvent as main components wherein the photocurable resin comprises a reaction product of: (A) an epoxy vinyl ester resin obtained by reacting a cresol novolak epoxy resin and an unsaturated monobasic acid, (B) a polybasic acid anhydride and (C) an alkyl ketene dimer. Moreover, the hydroxyl value of the photocurable resin should be not more than about 10 mg KOH/g.

Further in accordance with the present invention, there is provided an alkaline developable liquid photoimageable solder resist ink composition comprising a photo-curable resin, a photopolymerization initiator, an active diluent, a solvent and a thermosetting component as main components wherein the photocurable resin comprises a reaction product of: (A) an epoxy vinyl ester resin obtained by reacting a cresol novolak epoxy resin and an unsaturated monobasic acid, (B) a polybasic acid anhydride and (C) an alkyl ketene dimer. The hydroxyl value of the photocurable resin should be not more than about 10 mg KOH/g. The thermosetting component is preferably an epoxy compound having at least two epoxy groups per molecule.

3. DETAILED DESCRIPTION OF THE PREFERRED EMBODIMENTS

The "cresol novolak epoxy resin" which is employed in the formation of an epoxy vinyl ester resin (A) is defined herein as a resin produced by reacting a cresol novolak resin, prepared by reacting cresol and formaldehyde in the presence of an acid catalyst, with epichlorohydrin or methylepichlorohydrin. It is preferable that the epoxy equivalent of the cresol novolak epoxy resin be about 180 to 250 and the main component by a novolak having 10 phenolic units.

Examples of the useful novolak epoxy resins include, for instance, Araldite ECN-1299, which is a trade name of CIBA-GEIGY AG., Quatex 3710, which is a trade name of E. I. Du Pont de Nemours & Co., Sumiepoxy ESCN-220, which is a trade name of Sumitomo Chemical Company Limited, Epototo YDCN-220H, which is a trade name of Toto Chemical Co., Ltd., and the like. These cresol novolak epoxy resins may be replaced with other components such as phenol, bisphenol A and cresol, in an amount sufficient to prevent the deterioration of properties such as heat resistance.

Examples of unsaturated monobasic acids which may be reacted with the epoxy resin include: acrylic acid, methacrylic acid, crotonic acid, cinnamic acid, and the like. Acrylic acid is the acid which is preferably used, however.

The epoxy vinyl ester resin (A) is produced by reacting the cresol novolak epoxy resin and an unsaturated monobasic acid in the presence of an esterification catalyst. It is preferable that the epoxy vinyl ester resin (A) be produced by reacting 0.95 to 1.05 equivalent of the unsaturated monobasic acid per one epoxy equivalent of the cresol novolak epoxy resin. More preferably, all of the epoxy groups of the cresol novolak epoxy resin are reacted with the unsaturated monobasic acid.

Examples of the polybasic acid anhydride (B) include: dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylenetetrahydrophthalic anhydride, methylendomethylenetetrohydrophthalic anhydride, chlorendic anhydride and methyltetrahydrophthalic acid anhydride; aromatic polycarboxylic acid anhydrides such as trimellitic anhydride and pyromellitic dianhydride. Among them, it is preferable to employ hexahydrophthalic anhydride, succinic anhydride, and the like.

The alkyl ketene dimer (C) is shown by the general formula (I):

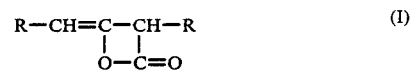

wherein R is a hydrogen atom or $C_nH_{2n+1}$ and n is an integer selected from 1, 2, 3 or 4.

Examples of the alkyl ketene dimer (C) include, for instance, diketene, methylketene dimer, ethylketene dimer, propylketene dimer, butylketene dimer, and the like. Among them, it is preferable to employ diketene.

Component (B) is employed to improve the alkaline developable property of the material by providing carboxyl groups to the resin. Component (C) is employed to improve the adhesion of the material by providing alkyl ketoester groups. The reason why the adhesion is improved has not yet been fully determined, but it can be postulated that the alkyl ketoester forms a chelate on the surface of copper. Another reason why component (B) and component (C) are employed is to improve the hygroscopic property of the resin by reacting the components (B) and (C) with the hydroxyl groups of the resin (A) so that the resultant photocurable resin is substantially free of hydroxyl groups.

The amounts of components (B) and (C) and the ratio between these components cannot be indiscriminately decided. However, in view of the considerations discussed above, when the amounts used and the ratio between these components fall within the following ranges, the resin thus produced has excellent properties. It is therefore preferable that m moles of component (B) and n moles of component (C) be employed on the basis of one equivalent of hydroxyl groups of the resin (A). m and n are positive numbers which satisfy the equations: $m+n=0.90$ to 1.10, preferably 0.95 to 1.05 and $n/(m+n)=0.1$ to 0.4, preferably 0.2 to 0.4. The phrase "m moles of the component (B) and n moles of the component (C) are employed on the basis of one equivalent of hydroxyl groups of the resin (A)" means that when, for instance, m and n satisfy the equation: $m+n=1$ wherein m and n are mole numbers of component (B) and component (C), respectively, $m \times 100\%$ and $n \times 100\%$ of all numbers of hydroxyl groups contained in the component (A) are reacted with the components (B) and (C), respectively, as is shown by the formula (II):

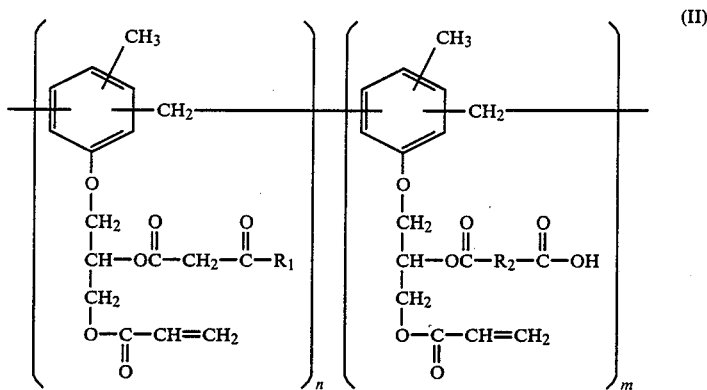

wherein $R_1$ is a residue of an alkyl ketene dimer, $R_2$ is a residue of a polybasic acid anhydride and m and n are positive numbers which satisfy the equation: $m+n=1$.

However, when $m+n$ is much smaller than 0.90, there is a reduction in the electrical insulating ability of the composition due to the presence of remaining hydroxyl groups. Alternatively, where $m+n$ is much larger than 1.10, no improvement in the properties of the composition occurs. Further, it is economically inappropriate for $m+n$ to be much larger than 1.10 since unreacted component (B) or (C) remains. Further, if $n/(m+n)$ is much smaller than 0.1, the adhesion is not good enough and where $n/(m+n)$ is much larger than 0.4, there is a tendency towards a reduction in the alkaline developable property.

The photo curable resin of the present invention is produced by the following process: after the polybasic acid anhydride (B) is added to a reaction system comprising an epoxy vinyl ester resin produced by the reaction of the cresol novolak epoxy resin (A) and an unsaturated monobasic acid; a polymerization inhibitor such as hydroquinone, methoquinone or anthraquinone; a known esterification catalyst such as dimethylbenzilamine, triethylamine, triphenylphosphate or imidazole and a solvent are reacted together, usually at a temperature of 50° to 100° C. for one to 8 hours. A solvent is then added along with the alkyl ketene dimers and these materials are reacted at a temperature of 40° to 90° C. for 2 to 8 hours. The above-mentioned process is only one of several possible processes of reacting the resin (A) and the components (B) and (C), and the present invention should not therefore be limited solely to the process disclosed above.

The hydroxyl value of the photo curable resin thus obtained should be no more than about 10 mg KOH/g. Moreover, it is more preferable that the hydroxyl value be lower than 5 mg KOH/g. When the hydroxyl value is more than 10 mg KOH/g, the hygroscopic properties of the material tend to deteriorate. It is also preferable that the acid value of the photocurable resin of the present invention be between 50 to 160 mg KOH/g. When the acid value is less than 50 mg KOH/g, the alkaline developable property is diminished and when the acid value is more than 160 mg KOH/g, the properties of the coating film, such as alkali resistance, are reduced.

In the present invention, any type of photo polymerization initiators may be employed. Examples of these initiators may include, for instance, benzoins and their monoalkyl ethers such as benzoin, benzoin ethyl ether and benzoin propyl ether, benzoates such as ethyl-4-dimethylamino benzoate, isoamyl-4-dimethylaminobenzoate, ethyl-2-dimethylaminobenzoate and benzoin aminobenzoate, methyl-4-dimethylaminobenzoate, 2-ethylhexyl-4-dimethylaminobenzoate; acetophenones such as acetophenone, 2-2, dimethoxy-2-phenylacetophenone, 2,2-diethoxy-2-phenylacetophenone and 1,1-dichloroacetophenone; anthraquinones such as 2-methylanthraquinone, 2-ethylanthraquinone, 2-t-butylanthraquinone and 1-chloroanthraquinone; thioxanthones such as 2,4-dimethylthioxanthone, 2,4-diethylthioxantone, 2-methylthioxantone, and 2-isopropylthioxantone; ketals such as acetophenone-dimethylketal and benzyldimethylketal; benzophenones such as benzophenone; 2-methyl-1-[4-(methylthio)phenyl]-2-morpholino-propane-1, and the like.

Among these initiators, it is more preferable to employ a combination of 2-methyl-1-[4-(methylthio)phenyl], -2-morpholino-propane-1 (Irgacure 907, made by Ciba-Geigy Co., Ltd.), 2,4-diethylthioxanthone (Kayacure DETX, made by Nippon Kayaku Co., Ltd.), 2-isopropyl thioxanthone, 2-methylthioxanthone, ethyl-4-dimethylamino benzoate (Kayacure EPA, made by Nippon Kayaku Co., Ltd.), isoamyl-4-dimethylaminobenzoate, ethyl-2-dimethylaminobenzoate, methyl-4-dimethylaminobenzoate, 2-ethylhexyl-4-dimethylaminobenzoate, and the like. It is most preferred to employ the combination of 2-methyl-1- [4-(methylthio)-phenyl] -2-morpholino propane-1, 2,4-diethylthioxanthone and ethyl-4-dimethylamino benzoate.

These compositions can provide good curing at both the surface and in the deep parts of resist film with less photo exposure, which is desirable in an actual production line.

Further, by controlling the thickness of the resist film and the amount of exposure, ghost imaging could be eliminated even when a resist film coated on both sides of a substrate is exposed at the same time. Also, these photopolymerization initiators may be employed together with a photopolymerization accelerator such as the benzoic acids or the tertiary amines. The amount of the photo polymerization initiator used should range between about 1 to 15 parts by weight, preferably between about 4 to 10 parts by weight based upon 100 parts by weight of the ink composition.

Also, as a reactive diluent, any type of conventional photopolymerizable water soluble monomers and/or non-water soluble monomers may be employed, alone or in admixture. Examples of useful water soluble monomers include, for instance, 2-hydroxylethyl acrylate, 2-hydroxypropyl acrylate, N-vinylpyrrolidone, acryloyl morpholine, methoxytetra-ethylene glycol acrylate, methoxypolyethylene glycol acrylate, polyethylene glycol diacrylate, N,N-dimethylacrylamide, N-methylolacrylamide, N,N-dimethylaminopropyl acrylamide, N,N-dimethylaminopropyl acrylate, methacrylates corresponding to the above acrylates, and the like.

Examples of non-water soluble monomers include, for instance, ethylene glycol diacrylate, triethylene glycol diacrylate, dipropylene glycol diacrylate, polypropylene glycol diacrylate, tripropylene glycol diacrylate, phenoxyethyl acrylate, tetrahydrofurfuril acrylate, cyclohexyl acrylate, trimethylolpropane triacrylate, glycerin diglycidyl eter diacrylate, glycerin diglycidyl eter triacrylate, pentaerythritol triacrylate, pentaerythritol tetraacrylate, dipentaerythritol pentaacrylate, dipentaerythritol hexaacrylate, methacrylates corresponding to the above acrylates, a polyester of a polybasic acid and hydroxyalkyl (meth)acrylate, and the like.

The amount of the reactive diluent used usually ranges between about 0.5 to 15 parts by weight, preferably 1 to 8 parts by weight, based upon 100 parts by weight of the ink composition. While any of the reactive diluents mentioned above can be effectively used, when a reactive diluent having a hydroxyl group is employed, it is preferable to use the reactive diluent in consideration of the amount used since there is a tendency that the electrical insulating property of a cured coating film may be diminished.

Various types of conventional solvents may be used with the invention. Examples of these solvents may include, for instance, ketones such as methyl ethyl ketone and cyclohexanone; aromatic hydrocarbons such as toluene and xylene; glycol ethers such as carbitol and butylcarbitol; acetic acid esters such as ethyl acetate, butyl acetate, glycol ether acetates such as cellosolve acetate, butyl cellosolve acetate, carbitol acetate, butylcarbitol acetate, and the like. The amount of the solvent used should be between about 5 to 50 parts by weight, preferably 20 to 30 parts by weight based upon 100 parts by weight of the ink composition.

Further, properties such as the heat resistance, chemical resistance, etc. of the coating film can be improved by employing a thermosetting component. Specifically, the thermosetting component used in the invention comprises an epoxy compound having two or more epoxy groups in the molecular unit thereof. Examples of these epoxy compounds include bis-phenol A epoxy resins, bis-phenol F epoxy resins, bis-phenol S epoxy resins, phenol novolak epoxy resins, cresol novolak epoxy resins, N-grycidyl epoxy resins, alicyclic epoxy resins and so forth. The aforementioned thermosetting component may be admixed with the photocurable resin, if desired, in advance of actual use.

The amount of thermosetting component used is preferably in the range of about 5 to 100 parts by weight, more preferably between about 10 to about 70 parts by weight, based upon 100 parts by weight of the photocurable resin. If the amount of the thermosetting component is below 5 parts by weight, there will be no improvement in the chemical resistance of a film thus coated. On the other hand, when exceeding 100 parts by weight, the removal of unexposed coated areas by the developer will be difficult. In addition, the definition of the resultant photoimage will be deteriorated.

Further, if necessary, various types of additive agents may be included in the composition of the present invention. These may include fillers such as silica, talc or clay, pigments, defoaming agents, tackifiers, levelling agents, photo curing accelerators, and the like.

Moreover, the compositions of the present invention may be prepared either as a one-part system or a two-part system. When employing an epoxy resin having a high reactivity, it is preferable to prepare a two-part system, one of which is an epoxy resin with a component containing carboxylic acids and another of which is an epoxy curing accelerator, which is useful from the viewpoint of enhanced storage stability. It is, however, preferable that the former component be dispersed to have a particle size of not more than 10 μm with a conventional desperser machine such as a dissolver or a three roll dispersion mill, since the component contains a filler, a pigment, and the like. The later component has only to be dissolved, since the component is not a dispersion system.

Examples of an irradiating source of light which may be employed to cure the composition of the present invention may include, for instance, a low pressure mercury lamp, a high pressure mercury lamp, an extra-high pressure mercury lamp, a xenon lamp, a metal halide lamp and the like.

The present invention is more specifically described and explained in the following Examples, in which all parts and percentages are by weight unless otherwise noted. It is to be understood, however, that the present invention is not limited to the Examples and various changes and modifications may be made in the invention without departing from the spirit and scope thereof.

3.1. EXAMPLE 1

A three-necked flask equipped with a temperature gauge, an agitator and a cooler, having a volume of 1000 ml, was charged with 333 g of a 25% cellosolve acetate solution of O-cresol novolak epoxy acrylate having a hydroxyl value of 225 mg KOH/g, an acid value of 1.4 mg KOH/g and an oxygen content contained in oxirane of 0.13% (1 g equivalent of hydroxyl groups). The flask was then charged with 0.3 g of hydroquinone monomethyl ether, 4.0 g of dimethylbenzylamine, 74 g of cellosolve acetate and 116 g of hexahydrophthalic anhydride (0.75 moles) and the reaction was carried out at a temperature of 95° C. for 2 hours. The reaction mixture was then diluted with 54 g of cellosolve acetate. The acid value and hydroxyl value of the reaction solution were 72.0 mg KOH/g and 25.6 mg KOH/g, respectively, and it was confirmed that 74% of the hydroxyl groups of the resin were half esterified. The temperature of the solution was subsequently adjusted to 50° C., and after 22 g of diketene (0.26 moles) was added to the solution and the temperature was maintained at 50° C. for 30 minutes, the temperature was raised to 80° C. and then was maintained for 1.5 hours. The varnish thus obtained was light yellow and transparent and had an acid value of 70.0 mg KOH/g and a hydroxyl value of 1.9 mg KOH/g.

A main agent A was prepared by mixing and kneading the following mixture in a three roll dispersion mill.

[Components of main agent A]

The varnish produced by the process of Example 1: 30–70 wt. %
Phthalocyanine Green (pigment): 0.5–2 wt. %
Mistron vapor (inorganic filler): 20–50 wt. %
Dipentaerythritol hexaacrylate: 3–15 wt. %
Hydroquinonmonomethyl ether: 0.1–1.0 wt. %

Modaflow (defoaming agent): 0.5-3.0 wt. %

An auxiliary agent A was prepared by dissolving the following components.

[Components of an auxiliary agent A]

Cresol novolak epoxy resin (Epoxy equivalent: 230): 10-30 wt. %

Cellosolve acetate: 5-20 wt. %

Irgacure 907 (photopolymerization initiator): 2-10 wt. %

Kayacure DETX (photopolymerization initiator): 1-7 wt. %

Kayacure EPA (photocuring accelerator): 0.5-5 wt. %

Main agent A and auxiliary agent A may be mixed together so that the ratio of main agent A/auxiliary agent A in proportion by weight ranges between about 100:20 to 100:60 parts by weight.

The mixture of main agent A and auxiliary agent A was coated over the whole surface of a printed circuit board, on which a circuit pattern had been formed in advance by an etching process using a screen printing machine, to form a photosensitive layer having a thickness of 15 to 20 mm. The layer was then dried at 60° C. for 40 minutes and the degree of tackiness of the layer was measured by finger touch.

Following this procedure, a negative mask was contacted closely with the coating layer and the mask was exposed to ultraviolet rays with water cooled type ultraviolet ray exposure equipment so that the exposure was 600 mJ./cm$^2$. The layer coating was developed by spraying a 1% aqueous solution of $Na_2CO_3$ at a pressure of 2 Kg/cm$^2$ for 60 seconds. The surfaces of the exposed and unexposed portions of the coating film were then observed by the naked eye. The coating film was then heated to a temperature of 140° C. for 40 minutes for post baking in order to cure the film. The physical properties of the coating film as a solder resist were measured by the methods described below. The results of these tests are set forth in Table 1.

3.1. (a) PHYSICAL PROPERTIES (1) Acid value

The term "acid value" in the specification refers to a value measured by the following method:

After a 1 to 2 g. sample was weighed and the sample was dissolved in 20 ml of acetone, 1 ml of water was added and the mixture was heated for 10 minutes without boiling. After the mixture was allowed to cool to room temperature, a small amount of phenolphthalein was added and a standard solution of $\frac{1}{2}$N KOH was continuously dropped into the mixture until the color of the mixture did not change. The amount of KOH solution used, in mg KOH/g, was then measured.

(2) Finger tack

The trackiness of the predried coating film was measured by finger touch and evaluated using the following standards:

5 ... No tackiness at all.
4 ... A little tackiness was felt, but there was no trace of a finger print.
3 ... A few traces of a finger print were left on the coating film.
2 ... A trace of a finger print was clearly left on the coating film.
1 ... The ink adhered to a finger.

(3) Resistance to the developing solution on exposed portions of the developed coating film The exposed surface of the developed coating film was observed by the naked eye and was evaluated using the following standards:

5 ... No changes in the coating film before and after development were observed.
4 ... The surface of the coating film was a little abraded and the developing solution adhered to the surface.
3 ... The developing solution adhered all over the surface of the coating film.
2 ... The entire surface of the coating film was abraded and gloss was not observed.
1 ... Peeling and flaking the coating film were observed.

(4) Resistance to the developing solution on unexposed portions of the developed coating film The unexposed surface of the developed coating film was observed by the naked eye and was evaluated using the following standards:

5 ... There was no residue on the surface at all. The glossy copper was observed.
4 ... A few oily and filmy residues were observed only on the surface of copper.
3 ... Some whitish residues were observed on the surface of the copper.
2 ... Some greenish residues were observed on the surface of the copper and glass-epoxy substrate.
1 ... Greenish residues were observed all over the surface.

(5) Pencil hardness

The pencil hardness of the coating films was measured and evaluated in accordance with the test method prescribed in JIS K-5400.

(6) Adhesion

In accordance with the test method prescribed in JIS D-0202, a coating film on the surface of a copper substrate was cut to form 100 squares, each measuring $1 \times 1$ mm and the procedure of adhesion-peeling off of cellophane adhesive tape was counted.

(7) Soldering heat resistance

In accordance with the test method prescribed in JIS C-6481, a test piece was floated in a molten solder bath at 260° C. for 10 seconds and then the test piece was allowed to cool to room temperature. After the above process was repeated 5 times, the coating film was observed by the naked eye and evaluated by the following standards:

5 ... There were no changes on the coating film.
4 ... A slight matted surface was observed.
3 ... Gloss shifting was clearly observed.
2 ... Partial blistering was observed.
1 ... Blister and peeling were observed all over the surface.

(8) Solvent resistance

After a test piece was dipped into methylene chloride at 25° C. for one hour, the coating film was observed by the naked eye and was evaluated by the following standards:

5 ... No changes were observed at all.
4 ... The coating film was partially swelled.
3 ... Swollen portions of the coating film were clearly observed.
2 ... The coating film was partially swollen and peeled off.
1 ... The entire surface of the coating film was peeled off.

(9) Insulation resistance

In accordance with IPC-SM-840A, the insulation resistance value of a test piece under normal conditions (i.e., 20° C., 60% RH) and the insulation resistance value of a test piece which was left in an atmosphere at a temperature of 60° C. and a relative humidity of 95% for 120 hours were measured with an instrument known as a TR-8601, produced by the Advantest Corporation. The applied voltage was 500 V and the applied time was one minute.

3.2. EXAMPLE 2

A vehicle was prepared in the same manner as in Example 1, except that 3.0 g. of triethylamine was used instead of 4.0 g. of dimethylbenzylamine and 108 g. of hexahydrophthalic anhydride (0.70 moles) and 29.5 g. of diketene (0.35 moles) were used to form a vehicle having an acid value of 65.4 mg KOH/g and a hydroxyl value of 0.3 mg KOH/g. A main agent B was prepared by mixing and kneading the following mixture with a three roll dispersion mill.

[Components of main agent B]

The light yellow and transparent varnish produced by the process of Example 2: 67.0 parts
Phthalocyanine Green (pigment): 1.0 part
Mistron monomix (inorganic filler): 25.0 parts
Titanium oxide: 0.5 parts
Trimethylolpropane triacrylate: 5.0 parts
Hydroquinonemonomethyl eter: 0.5 parts
Modaflow (defoaming agent): 1.0 part

3.3. EXAMPLE 3

A vehicle was prepared in the same manner as in Example 1 except that 70 g. of succinic anhydride (0.70 moles) was used instead of 116 g. of hexahydrophthalic anhydride and 25 g. of diketene (0.30 moles) was employed to form a vehicle having an acid value of 70.1 mg KOH/g and a hydroxyl value of 0.9 mg KOH/g. A main agent C was prepared by mixing and kneading the following mixture with a three roll dispersion mill.

[Components of main agent C]

The light yellow and transparent varnish produced by the process of Example 3: 64.5 parts p0 Phthalocyanine Green (pigment): 1.0 part
Powdered silica: 30.0 parts
Titanium oxide: 1.0 part
Neopentylglycol diacrylate: 3.0 parts
Hydroquinonemonomethyl ether: 0.2 parts
Flowlene AC-300 (defoaming agent): 1.0 part An auxiliary agent B was prepared by mixing and dissolving the following components:

The preparation procedure of Example 1 was repeated except that main agent A was replaced by main agent C and auxiliary agent A was replaced by auxiliary agent B to form a solder resist. The physical properties of the coating film were measured with the same methods as used in Example 1. The results are set forth in Table 1.

[Components of auxiliary agent B]

Cresol novolak epoxy resin (Epoxy equivalent: 230): 20.7 parts
Cellosolve acetate: 10.5 parts
Irgacure 907 (photopolymerization initiator): 7.2 parts
Kayacure DETX (photopolymerization initiator): 4.8 parts
Kayacure EPA (photocuring accelerator): 1.8 parts

3.4. EXAMPLE 4

The procedure of Example 1 was repeated except that 58.8 g of butylketene dimer (0.30 moles) was used instead of 22 g. of diketene to form a vehicle having an acid value of 66.0 mg KOH/g. and a hydroxyl value of 1.3 mg KOH/g. A main agent D was prepared by mixing and kneading the following mixture with a three roll dispersion mill:

The procedure of Example 1 was repeated except that main agent D was used instead of main agent A to form a solder resist. The physical properties of the coating film were measured by the same methods as in Example 1. The results are shown in Table 1.

[Components of main agent D]

The light yellow and transparent varnish produced by the above process: 53.5 parts
Phthalocyanine Green (pigment): 1.0 part
Mistron vapor: 35.0 parts
Dipentaerythritol hexaacrylate: 9.0 parts
Hydroquinonemonomethyl ether: 0.5 parts
Modaflow (defoaming agent): 1.0 part

3.5. EXAMPLE 5

Using the varnish obtained in Example 1, a single-component resist ink composition (single-component S) was prepared by mixing and kneading the following mixture with a three roll dispersion mill:
The varnish produced by the above process: 55 parts
Phthalocyanine Green (pigment): 1 part
Dipenthaerythritol hexaacrylate: 3 parts
Hydroquinonemonoethyl ether: 0.5 parts
Kayacure DETX (photopolymerization initiator): 3 parts
Kayacure EPA (photopolymerization initiator): 1 part
n Irgacure 907 (photopolymerization initiator): 3 parts
Mistron Vapor (inorganic filler): 22 parts
Modaflow (defoaming agent): 1 part
Cellosolve acetate: 10.5 parts The physical properties of the coating film were measured by the same methods as in Example 1.
The results are shown in Table 1.

3.6. COMPARATIVE EXAMPLE 1

A varnish having an acid value of 72.9 mg KOH/g and a hydroxyl value of 25.5 mg KOH/g, which was not reacted with the diketene obtained in Example 1, was employed to form main agent E. The main agent E was prepared by mixing and dissolving the following components with a three roll dispersion mill:

[Components of main agent E]

The light yellow and transparent varnish described above: 55.0 parts
Phthalocyanine Green (pigment): 1.0 part
Mistron vapor (inorganic filler): 33.5 parts
Dipentaerythritol hexaacrylate: 9.0 parts
Hydroquinonemonomethyl ether: 0.5 parts
Modaflow (defoaming agent): 1.0 part A solder resist was formed in the same manner as in Example 1 except that main agent E was used instead of main agent A. The physical properties of the coating film were measured by the methods used in Example 1. The results are shown in Table 1.

3.7. COMPARATIVE EXAMPLE 2

A vehicle having an acid value of 98.5 mg KOH/g and a hydroxyl value of 1.4 mg KOH/g was prepared in the same manner as in Example 1, except that the amount of hexayhydrophthalic anhydride and cellosolve acetate used were 154 g (1.00 moles) and 80 g, respectively, to give a main agent F. The main agent F was prepared by mixing and dissolving the following components with a three roll dispersion mill:

[Components of main agent F]

The light yellow and transparent varnish produced by the above process: 58.0 parts
Phthalocyanine Green (pigment): 1.0 part
Mistron vapor (inorganic filler): 30.5 parts
Dipentaerythritol hexaacrylate: 9.0 parts
Hydroquinonemonomethyl ether: 0.5 parts
Modaflow (defoaming agent): 1.0 part A solder resist was formed in the same manner as in Example 1, except that main agent F was used instead of main agent A. The physical properties of the coating film were measured using the methods described in Example 1. The results are shown in Table 1.

3.8. COMPARATIVE EXAMPLE 3

A varnish which was not reacted with diketene, i.e., as obtained in Example 1, was reacted with 145 g. of 50% cellosolve acetate solution of an adduct of trilenediisocyanate and 2-hydroxyethyl acrylate, the mole ratio of trilenediisocyanate/2-hydroxyethyl acrylate being 1:1, at 70° C. for 3 hours to give an urethane modified resin having an acid value of 58.4 mg KOH/g and a hydroxyl value of 2.1 mg KOH/g.

Main agent G was then prepared by mixing and dissolving the following components with a three roll dispersing mill.

[Components of main agent G]

The light yellow and transparent varnish produced by the above process: 48.0 parts
Cellosolve acetate: 10.5 parts
Phthalocyanine Green (pigment): 1.0 part
Mistron vapor (inorganic filler): 30.0 parts
Dipentaerythritol hexaacrylate: 9.0 parts
Hydroquinonemethyl ether: 0.5 parts
Modaflow (defoaming agent): 1.0 part A solder resist was formed in the same manner as in Example 1 except that main agent G was used instead of main agent A. The physical properties of the coating film were measured by the same methods as used in Example 1. The results are shown in Table 1.

It is obvious from the results shown in Table 1 that the alkaline developable liquid photoimageable solder resist ink composition of the present invention have excellent adhesion, heat resistance, moisture insulation resistance and alkaline developability. Therefore, the composition can be suitably applied to a printed circuit board or other similar substrate.

While it is apparent that the invention herein disclosed is well calculated to fulfill the objectives stated above, it will be appreciated that numerous modification and embodiments may be devised by those skilled in the art. It is intended that the appended claims cover all such modifications and embodiments as fall within the true spirit and scope of the present invention.

TABLE 1

| Ex. No. | Main agent | Auxiliary agent | Main agent/ Auxiliary agent | Finger tack | Developing solution resistance at exposed portions | Developing solution resistance at unexposed portions | Pencil hardness | Adhesion property |
|---|---|---|---|---|---|---|---|---|
| 1 | A | A | 100/45 | 5 | 5 | 5 | 6H | 100/100 |
| 2 | B | A | 100/45 | 5 | 5 | 5 | 6H | 100/100 |
| 3 | C | B | 100/45 | 5 | 5 | 5 | 7H | 100/100 |
| 4 | D | B | 100/45 | 5 | 5 | 5 | 6H | 100/100 |
| 5 | — | — | Single component | 5 | 5 | 5 | 6H | 100/100 |
| Com. Ex. 1 | E | A | 100/45 | 5 | 1 | 5 | 6H | 60/100 |
| Com. Ex. 2 | F | A | 100/45 | 5 | 4 | 4 | 5H | 50/100 |
| Com. Ex. 3 | G | A | 100/45 | 5 | 5 | 1 | 6H | 80/100 |

| Ex. No. | Soldering heat resistance | Solvent resistance | Insulation Resistance (ohms) Normal condition | Insulation Resistance (ohms) After treatment |
|---|---|---|---|---|
| 1 | 5 | 5 | $6 \times 10^{13}$ | $3 \times 10^{13}$ |
| 2 | 5 | 5 | $5 \times 10^{13}$ | $4 \times 10^{13}$ |
| 3 | 5 | 5 | $6 \times 10^{13}$ | $2 \times 10^{13}$ |
| 4 | 4 | 5 | $6 \times 10^{13}$ | $4 \times 10^{13}$ |
| 5 | 3 | 4 | $3 \times 10^{13}$ | $5 \times 10^{12}$ |
| Com. Ex. 1 | 4 | 4 | $6 \times 10^{13}$ | $3 \times 10^{9}$ |
| Com. Ex. 2 | 2 | 2 | $5 \times 10^{13}$ | $6 \times 10^{12}$ |
| Com. Ex. 3 | 2 | 3 | $6 \times 10^{13}$ | $4 \times 10^{12}$ |

What we claim is:

1. A composition useful as an alkaline developable liquid photoimageable solder resist ink consisting essentially of a photocurable resin, a photopolymerization initiator, a reactive diluent and a solvent wherein said photocurable resin is a reaction product of: (A) an epoxy vinyl ester resin obtained by reacting a cresol novolak epoxy resin and an unsaturated monobasic acid, (B) a polybasic acid anhydride and (C) an alkyl ketene dimer, wherein the amounts of said polybasic acid anhydride and said alkyl ketene dimer included is said composition are m mole and n mole respectively, based upon one equivalent of hydroxyl groups of said epoxy vinyl ester resin, wherein said m and said n are positive numbers which satisfy the equations: $m+n=0.90$ to $1.10$ and $n/(m+n)=0.1$ to $0.4$ and wherein the hydroxyl value of said photocurable resin ranges between 0 to 10 mg KOH/g.

2. The composition of claim 1 wherein the hydroxyl value of said photocurable resin ranges between 0 to 5 mg KOH/g.

3. The composition of claim 1 wherein $m+n=0.95$ to 1.15 and $n/(m+n)=0.2$ to 0.4.

4. The composition of claim 1 wherein the acid value of said photocurable resin ranges between 50 to 160 mg KOH/g.

5. The composition of claim 1 wherein said unsaturated monobasic acid is acrylic acid.

6. The composition of claim 1 wherein said polybasic acid anhydride is selected from hexahydrophthalic anhydride and succinic anhydride.

7. The composition of claim 1 wherein said alkyl ketene dimer is diketene.

8. The composition of claim 1 wherein said photo polymerization initiator is 2-methyl-1-[4-(methylthio)-phenyl]-2-morpholino-propane-1.

9. The composition of claim 1 wherein said photo polymerization initiator comprises 2-methyl-1-4[(methylothio)phenyl]-2-morpholino-propane-1 and at least one composition selected from the group consisting of 2,4-diethylthioxanthone, ethyl-4-dimethylaminobenzoate, and the derivatives thereof.

10. A composition useful as an alkaline developable liquid photoimageable solder resist ink consisting essentially of a photocurable resin, a photopolymerization initiator, a reactive diluent, a solvent and a thermosetting component, wherein said photocurable resin is a reaction product of: (A) an epoxy vinyl ester resin obtained by reacting a cresol novolak epoxy resin and an unsaturated monobasic acid, (B) a polybasic acid anhydride and (C) an alkyl ketene diner, wherein the amounts of said polybasic anhydride and said alkyl ketene dimer included in said composition are m mole and n mole respectively, based upon one equivalent of hydroxyl groups of said epoxy vinyl ester resin, wherein said m and said n are positive numbers which satisfy the equations: $m+n=0.90$ to 1.10 and $n/(m+n)=0.1$ to 0.4 and wherein the hydroxyl value of said photocurable resin ranges between 0 to 10 mg KOH/g and further wherein said thermosetting component is an epoxy compound having at least two epoxy groups per molecule thereof.

11. The composition of claim 10 wherein the acid value of said photocurable resin ranges between 50 to 160 mg KOH/g.

12. The compostion of claim 10 wherein said thermosetting component is selected from the group consisting of a bis-phenol A epoxy resin, a bis-phenol F epoxy resin, a phenol novolak epoxy resin, a cresol novolak epoxy resin and mixtures thereof.

13. The composition of claim 10 wherein said thermocurable component is added in an amount ranging between about 5 to about 100 parts by weight, based upon 100 parts by weight of said photocurable resin.

* * * * *